(12) United States Patent
Hara et al.

(10) Patent No.: US 11,425,850 B2
(45) Date of Patent: Aug. 23, 2022

(54) FEEDER

(71) Applicant: FUJI CORPORATION, Chiryu (JP)

(72) Inventors: Akira Hara, Toyohashi (JP); Akira Takahashi, Okazaki (JP); Hiroyasu Ohashi, Toyota (JP)

(73) Assignee: FUJI CORPORATION, Chiryu (JP)

( * ) Notice: Subject to any disclaimer, the term of this patent is extended or adjusted under 35 U.S.C. 154(b) by 540 days.

(21) Appl. No.: 16/492,428

(22) PCT Filed: Apr. 5, 2017

(86) PCT No.: PCT/JP2017/014265
§ 371 (c)(1),
(2) Date: Sep. 9, 2019

(87) PCT Pub. No.: WO2018/185886
PCT Pub. Date: Oct. 11, 2018

(65) Prior Publication Data
US 2020/0045861 A1    Feb. 6, 2020

(51) Int. Cl.
*H05K 13/04* (2006.01)
*H05K 13/08* (2006.01)

(52) U.S. Cl.
CPC ....... *H05K 13/0419* (2018.08); *H05K 13/082* (2018.08); *H05K 13/0882* (2018.08)

(58) Field of Classification Search
CPC ............. H05K 13/0419; H05K 13/082; H05K 13/0882
See application file for complete search history.

(56) References Cited

FOREIGN PATENT DOCUMENTS

| JP | 2006237427 | * | 9/2006 |
| JP | 4232639 | * | 12/2008 |
| JP | 4882411 | * | 12/2011 |
| JP | 5850780 | * | 12/2016 |
| JP | 6085418 | * | 2/2017 |
| WO | WO 2015/181958 A1 | | 12/2015 |

OTHER PUBLICATIONS

International Search Report dated Jun. 27, 2017 in PCT/JP2017/014265 filed on Apr. 5, 2017.

* cited by examiner

*Primary Examiner* — Carl J Arbes
(74) *Attorney, Agent, or Firm* — Oblon, McClelland, Maier & Neustadt, L.L.P.

(57) ABSTRACT

The feeder includes a first sprocket provided in an insertion section, having engagement protrusions, engageable with engagement holes of a carrier tape, formed on only a part of the outer circumference, and a second sprocket arranged side by side with the first sprocket, on the supply section side of the first sprocket, having engagement protrusions formed over the entire circumference. A control device of the feeder restricts contact between the engagement protrusions of the first sprocket facing the carrier tape and the carrier tape after the engagement protrusions of the second sprocket disengage from the carrier tape in an unloading process of conveying the carrier tape to the insertion section side.

9 Claims, 6 Drawing Sheets

FEEDER

TECHNICAL FIELD

The present application relates to a feeder.

BACKGROUND ART

Feeders are used in electronic component mounting machines for mounting components on circuit boards. For example, as disclosed in Patent Literature 1, there are feeders that are of an autoloading type in which a carrier tape inserted from an insertion section provided at a rear portion of the feeder is automatically loaded. The autoloading feeder, for example, rotates a pair of sprockets arranged side by side in the conveyance direction of the carrier tape with the sprockets engaged with engagement holes of the carrier tape to convey the carrier tape.

PATENT LITERATURE

Patent Literature 1: WO 2015/181958

BRIEF SUMMARY

Technical Problem

In the sprocket on the insertion section side in the feeder of Patent Literature 1, for example, in order to intermittently convey carrier tape, engagement protrusions that engage with the engagement holes of the carrier tape are formed only on a part of the outer circumference. In such a configuration, at the end stage of the unloading process for conveying the carrier tape to the insertion section side, the carrier tape is intermittently conveyed only by the sprocket on the insertion section side. If the carrier tape, the engagement holes, and the engagement protrusions of the sprocket deviate from each other, the engagement protrusions may come in contact with portions other than the engagement holes of the carrier tape, thereby deforming or scratching the carrier tape.

An object of the present specification is to provide a feeder configured to prevent deformation or the like of the carrier tape in the unloading process.

Solution to Problem

The present specification discloses a feeder configured to convey a carrier tape from an insertion section to a supply section, the insertion section being configured to insert a carrier tape containing an electronic component, and the supply section being configured to supply the electronic component to an electronic component mounting machine; the feeder comprising: a first sprocket provided in the insertion section and having engagement protrusions, formed on only a part of the outer circumference, engageable with engagement holes of the carrier tape; a second sprocket arranged side by side with respect to the first sprocket and formed on the supply section side; and a control device configured to control a rotational operation of the first sprocket and the second sprocket, and restrict contact between the engagement protrusions of the first sprocket and the carrier tape after the engagement protrusions of the second sprocket disengage with the engagement holes of the carrier tape in an unloading process for conveying the carrier tape to the insertion section side.

Advantageous Effects

With such a configuration, after the second sprocket disengages from the carrier tape in the unloading process, contact between the engagement protrusions of the first sprocket and the carrier tape is restricted. As a result, even if the carrier tape is displaced in the conveyance direction by an external force, contact of the engagement protrusions with a portion other than the engagement holes of the carrier tape is restricted. Therefore, modifications or the like of the carrier tape due to contact between the engagement projections of the first sprocket and the carrier tape can be reliably prevented.

DESCRIPTION OF EMBODIMENTS

1. Embodiment

1-1. Overview of Feeder 1

Figure 1:
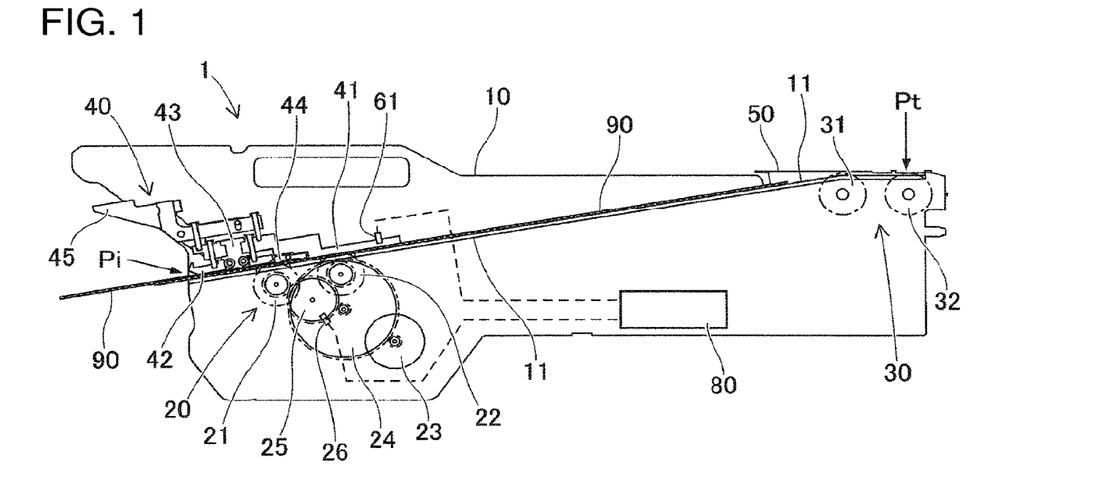
FIG. 1 A side view showing the entire feeder in an embodiment.

Feeder 1 is an autoloading-type tape feeder used in an electronic component mounting machine for mounting components on a circuit board to produce a board product. As shown in FIG. 1, feeder 1 performs a loading process for conveying carrier tape 90 from insertion section Pi along rail 11. Feeder 1 conveys loaded carrier tape 90 to supply section Pt for supplying the electronic component (hereinafter, simply referred to as "component") to the electronic component mounting machine, making it possible for the component to be supplied at supply section Pt. Feeder 1 conveys carrier tape 90 by moving carrier tape 90 at a predetermined pitch while being set in the electronic component mounting machine.

Feeder 1 conveys carrier tape 90 for replenishment when, for example, the remaining amount of carrier tape 90 currently in use is less than a predetermined amount. As a result, feeder 1 can continuously supply components to the current carrier tape 90 for replenishment without splicing carrier tape 90. When a loaded carrier tape 90 is removed, feeder 1 performs an unloading process of conveying carrier tape 90 to the insertion section Pi side.

1-2. Configuration of Carrier Tape 90

Figure 2:
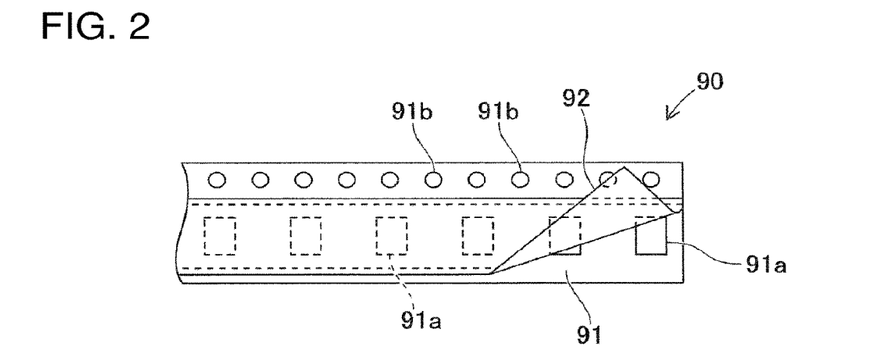
FIG. 2 A top view showing a portion of a carrier tape.

As shown in FIG. 2, carrier tape 90 accommodates a large number of components in a line. Carrier tape 90 includes base tape 91 and cover tape 92. Base tape 91 is made of a flexible material such as paper or resin. In base tape 91, storage sections 91a are formed at the center in the width direction (i.e., the vertical direction in FIG. 2). Each storage section 91a has a recessed shape with a bottom. Storage sections 91a are formed at regular intervals in the longitudinal direction (i.e., the left-right direction in FIG. 2) of base tape 91. Each storage section 91a stores one component.

Engagement holes 91b are formed in base tape 91 at one edge in the width direction. Engagement holes 91b are formed at regular intervals in the longitudinal direction of base tape 91. Engagement holes 91b penetrate carrier tape 90 in the thickness direction (i.e., the front-rear direction in FIG. 2). In the present embodiment, the interval between adjacent engagement holes 91b is set to be smaller than the interval between adjacent storage sections 91a.

Cover tape 92 is made of a thin film-like polymer film. Both edges of cover tape 92 in the width direction are bonded to the upper surface of base tape 91. As a result, cover tape 92 closes the openings of storage sections 91a. As a result, the components accommodated in storage sections 91a of base tape 91 are prevented from falling out. Cover tape 92 is peeled off by tape guide 50 of feeder 1 immediately before supply section Pt of feeder 1. Hereinafter, carrier tape 90 is referred to as "tape 90".

1-3. Detailed Configuration of Feeder 1

As shown in FIG. 1, feeder 1 includes feeder main body 10, first driving device 20, second driving device 30, tape support unit 40, tape guide 50, tape sensor 61, and control device 80. In the following description, the downstream side (the right side in FIG. 1) in the conveyance direction in which tape 90 is conveyed in the loading process is defined as the front, and the upstream side (the left side in FIG. 1) in the conveyance direction is defined as the rear.

Feeder main body 10 is formed in a flat box shape, and is set in a slot of a component supply device constituting an electronic component mounting machine. Rail 11 for supporting tape 90 inserted from insertion section Pi into which tape 90 is inserted is formed in feeder main body 10. Insertion section Pi is provided at the rear of feeder main body 10, and is located lower than supply section Pt. In this specification, insertion section Pi is a section of feeder 1 where tape 90 is inserted and constitutes a range in which tape 90 is supported between tape support unit 40 and rail 11 which will be described later. Rail 11 constitutes a conveyance path for supporting tape 90 from below, from insertion section Pi to supply section Pt.

Figure 3:
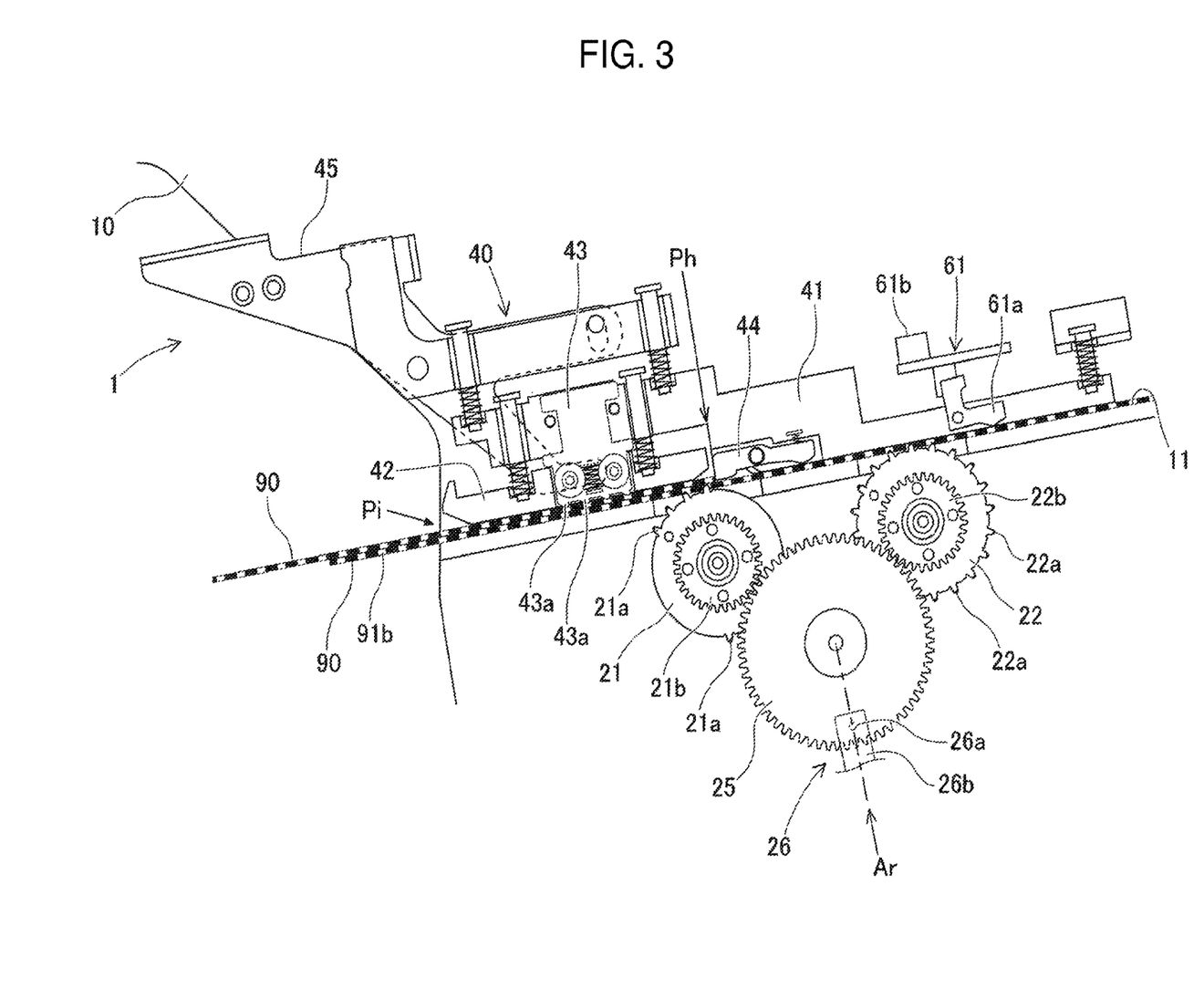
FIG. 3 An enlarged detail of part of FIG. 1.

First driving device 20 has first sprocket 21 and second sprocket 22 rotatably supported by feeder main body 10. First sprocket 21 and second sprocket 22 are provided to insertion section Pi. As shown in FIG. 3, in first sprocket 21, engagement protrusions 21a engageable with engagement holes 91b of tape 90 are formed only on a part of the outer circumference. Second sprocket 22 is arranged side by side with first sprocket 21 on the supply section Pt side with respect to first sprocket 21. Second sprocket 22 is formed with engagement protrusions 22a over the entire circumference.

As shown in FIG. 1, first driving device 20 includes stepping motor 23 as a driving source for rotating first sprocket 21 and second sprocket 22. Stepping motor 23 rotates the rotation shaft in accordance with the input pulse power. When the rotation shaft of stepping motor 23 rotates, reduction gear 24 meshing with the drive gear provided on the rotation shaft rotates. The driving force outputted by stepping motor 23 is transmitted to first sprocket 21 and second sprocket 22 via intermediate gear 25 meshing with reduction gear 24.

As shown in FIG. 3, intermediate gear 25 constantly meshes with sprocket gear 21b provided on first sprocket 21 and sprocket gear 22b provided on second sprocket 22. In the present embodiment, intermediate gear 25 is shared so as to directly rotate first sprocket 21 and second sprocket 22 together. The number of teeth on sprocket gear 21b and sprocket gear 22b is equal and is set to half the number of teeth on intermediate gear 25. That is, when intermediate gear 25 makes one rotation, first sprocket 21 and second sprocket 22 make two rotations. In this manner, first sprocket 21 and second sprocket 22 are synchronized so that the rotational direction and the circumferential speed are always equal.

First driving device 20 includes angle detection device 26 for detecting the angle of intermediate gear 25. Angle detection device 26 includes Hall magnet 26a and Hall sensor 26b. One Hall magnet 26a is provided at a predetermined position of intermediate gear 25. Hall sensor 26b is fixed to feeder main body 10 and detects Hall magnet 26a.

Here, the angle of intermediate gear 25 when Hall magnet 26a is detected by Hall sensor 26b is defined as reference angle Ar of intermediate gear 25. Angle detection device 26 configured as described above detects whether intermediate gear 25 is at reference angle Ar. When first sprocket 21 is assembled to feeder main body 10, first sprocket 21 is arranged so that when intermediate gear 25 is at reference angle Ar, all of the multiple engagement protrusions 21a are under rail 11 (see the upper part of FIG. 6).

In first driving device 20 having the above-described configuration, first sprocket 21 rotates once for every half rotation of intermediate gear 25. First sprocket 21 engages with tape 90 with at least a part of the multiple engagement protrusions 21a protruding upward from rail 11. With such a configuration, first driving device 20 can intermittently convey tape 90 engaged with first sprocket 21 by rotating intermediate gear 25 before the front end of tape 90 reaches second sprocket 22.

Second driving device 30 has third sprocket 31 and fourth sprocket 32 provided below the rail in supply section Pt. Like second sprocket 22, third sprocket 31 and fourth sprocket 32 have engagement protrusions (not shown) over the entire circumference. The configuration of second driving device 30 for rotating third sprocket 31 and fourth sprocket 32 is substantially the same as that of first driving device 20, and therefore detailed description thereof is omitted.

Tape support unit 40 is disposed above rail 11 where first driving device 20 is located in the conveyance direction of tape 90. Tape support unit 40 presses tape 90, interposed between tape support unit 40 and rail 11, against rail 11 to restrict upward movement of tape 90. Thus, tape support unit 40 assists in the engagement of engagement holes 91b of tape 90 with first sprocket 21 and second sprocket 22 of first driving device 20. Tape support unit 40 also supports tape 90, for replenishing, that has been inserted in a scheduled manner into the current tape 90.

More specifically, tape support unit 40 includes first pressing member 41, second pressing member 42, retaining device 43, stopper 44, and operation lever 45. First pressing member 41 is provided on feeder main body 10 so as to be movable in a direction perpendicular to the conveyance direction of tape 90. First pressing member 41 mainly presses tape 90, engaged with the second sprocket 22, against rail 11 by an elastic force of a spring (not shown). Second pressing member 42 is provided on first pressing member 41 so as to be movable in a direction perpendicular to the conveyance direction of tape 90. Second pressing member 42 presses tape 90, inserted between insertion section Pi and first sprocket 21, against rail 11 by an elastic force of a spring (not shown).

When the end of tape 90 is on the insertion section Pi side from defined position Ph between first sprocket 21 and second sprocket 22, retaining device 43 engages with engagement holes 91b of tape 90 to restrict the movement toward insertion section Pi. More specifically, retaining device 43 is provided so as to be movable relative to second pressing member 42 so that multiple claws 43a can engage with engagement holes 91b of tape 90 in a range in the conveyance direction in which second pressing member 42 contacts tape 90.

In the present embodiment, defined position Ph is an end on the insertion section Pi side of the range in the conveyance direction in which first pressing member 41 contacts tape 90. In other words, defined position Ph is a position in the conveyance direction at which tape 90 first contacts first pressing member 41 when tape 90 is inserted from insertion section Pi. When first pressing member 41 is pushed up by tape 90 conveyed so that the end of tape 90 is positioned closer to supply section Pt side than defined position Ph, retaining device 43 moves upward in conjunction with first pressing member 41. As a result, retaining device 43 is in a state in which claws 43a are removed from engagement holes 91b of tape 90 and does not retain tape 90.

Stopper 44 is provided so as to be tiltable with respect to first pressing member 41. Stopper 44 contacts the end of replenishment tape 90 inserted above the current tape 90, and restricts the movement of replenishment tape 90 toward supply section Pt. Operation lever 45 is rotatably provided on feeder main body 10. Operation lever 45 receives an operational force and forcibly moves retaining device 43 upward, thereby releasing retaining device 43 from tape 90.

Tape guide 50 is disposed above rail 11 at which third sprocket 31 and fourth sprocket 32 of second driving device 30 are located in the conveyance direction of tape 90. Tape guide 50 restricts the upward movement and the widthwise movement of tape 90 to guide the engagement of tape 90 with third sprocket 31 and fourth sprocket 32.

Tape sensor 61 is provided on supply section Pt side from second sprocket 22 in the conveyance direction of tape 90. Tape sensor 61 detects the presence or absence of tape 90 on rail 11. In the present embodiment, tape sensor 61 includes dog 61a that rotates when tape 90 is conveyed to the detection position, and microsensor 61b that detects the rotation of dog 61a. In addition to the above-described configuration, a non-contact type sensor or the like may be employed as tape sensor 61 as long as the presence or absence of tape 90 at the detection position can be detected.

Figure 4:
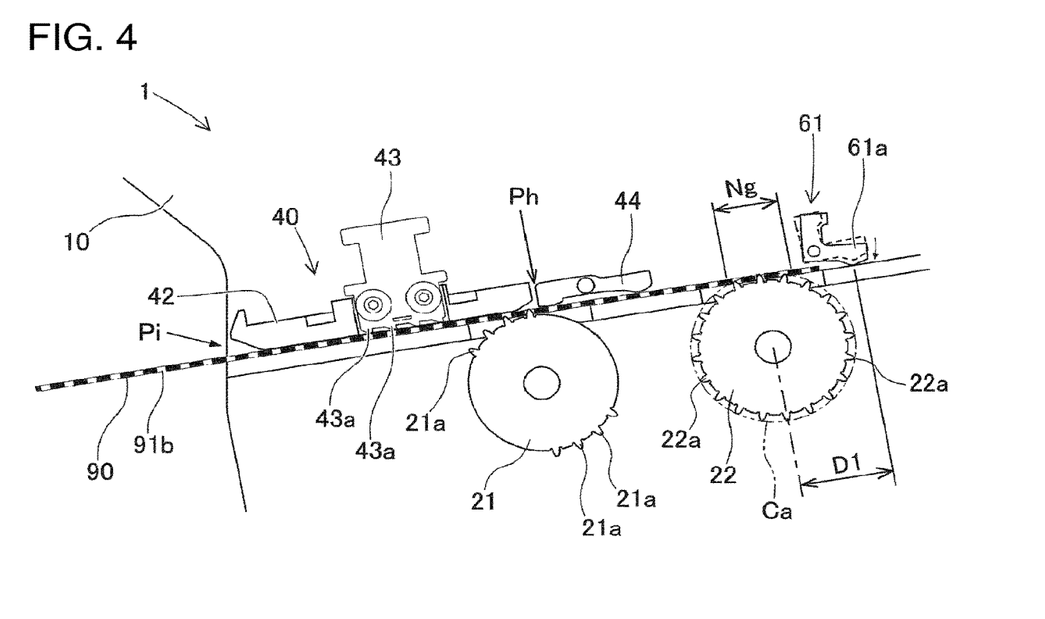
FIG. 4 A positional relationship of each component in FIG. 3.

Thus, tape sensor 61 detects the end of tape 90 by shifting from a state in which tape 90 is not on rail 11 to a state in which tape 90 is on rail 11, or by shifting from a state in which tape 90 is on rail 11 to a state in which tape 90 is not on rail 11. Tape sensor 61 is disposed at predetermined distance D1 in the conveyance direction of tape 90 from second sprocket 22. In the present embodiment, distance D1 between second sprocket 22 and tape sensor 61 corresponds to the distance between the rotation axis of second sprocket 22 and the detection position of tape sensor 61, as shown in FIG. 4.

Control device 80 mainly includes a CPU, various types of memory, and a control circuit. When feeder 1 is set in the electronic component mounting machine, electric power is supplied from the electronic component mounting machine via a connector, and control device 80 is in a state in which communication with the electronic component mounting machine is possible. Control device 80 controls the operations of first driving device 20 and second driving device 30 based on control commands or the like from the electronic component mounting machine. As a result, control device 80 executes a loading process for loading tape 90 into feeder 1, a supplying process for feeding and moving tape 90 at a predetermined pitch, and an unloading process for removing tape 90 from feeder 1.

Here, in the loading process described above, control device 80 drives first driving device 20 when the sensor (not shown) detects that the front end of tape 90 has been inserted from insertion section Pi. When engagement protrusions 21a of first sprocket 21 engage with engagement holes 91b at the front end of tape 90, tape 90 is intermittently conveyed toward second sprocket 22. Thereafter, when engagement protrusions 22a of second sprocket 22 engage with engagement holes 91b at the front end of tape 90, tape 90 is conveyed to supply section Pt side at a constant speed.

In the unloading process, control device 80 drives first driving device 20 until tape 90 loaded in feeder 1 is disengaged from second sprocket 22. At the end of the unloading process, it is assumed that, when tape 90 is disengaged from second sprocket 22, first sprocket 21 is engaged with or disengaged from tape 90 depending on the angle of first sprocket 21.

When tape 90 is disengaged from both first sprocket 21 and second sprocket 22, tape 90 may slide due to an external force in the conveyance direction or the like, and engagement holes 91b may deviate from engagement protrusions 21a of first sprocket 21. When the rotation of the first sprocket 21 is maintained in this state, engaging protrusions 21a may contact the lower surface of tape 90 and push tape 90 upward. In this case, tape 90 may be deformed or damaged, and it is not preferable for the rotation of first sprocket 21 to be kept in the above-described state.

Therefore, in the unloading process, after second sprocket 22 is disengaged from tape 90, control device 80 restricts contact between engagement protrusions 21a of first sprocket 21 and engagement holes 91b of tape 90. In other words, in the unloading process, control device 80 controls the rotation amount and the like of first sprocket 21 in accordance with the state of tape 90 and first sprocket 21, thereby restricting contact between engagement protrusions 21a of first sprocket 21 and tape 90 again after first sprocket 21 and second sprocket 22 are both disengaged from tape 90. "Contact" refers to a state in which engagement protrusions 21a of first sprocket 21 are engaged with engagement holes 91b of tape 90 or a state in which engagement protrusions 21a come in contact with a portion other than engagement holes 91b.

Further, control device 80 calculates the angle of first sprocket 21 based on the angle of intermediate gear 25 detected by angle detection device 26 and a rotation amount Rm of intermediate gear 25 corresponding to the pulse power input to stepping motor 23. More specifically, control device 80 acquires the rotation amount Rm of intermediate gear 25 corresponding to the pulse power input to stepping motor 23 until now after angle detection device 26 detects that intermediate gear 25 is at reference angle Ar.

Here, as described above, when intermediate gear 25 is at reference angle Ar, first sprocket 21 is assembled to have initial angle $\alpha$ (i.e., the angle at which engagement protrusions 21a face the conveyance direction). Since the number of teeth of intermediate gear 25 is an integer multiple of the number of teeth of sprocket gear 21b of first sprocket 21 (i.e., twice in the present embodiment), first sprocket 21 always has initial angle $\alpha$ when intermediate gear 25 is at reference angle Ar.

Therefore, when it is detected that intermediate gear 25 is at reference angle Ar, control device 80 recognizes that first sprocket 21 is at initial angle $\alpha$. Then, control device 80 adds a rotation amount Rs1 of first sprocket 21, corresponding to the rotation amount Rm of the intermediate gear 25, thereafter to initial angle α to calculate the current angle (α+Rs1) of first sprocket 21.

In the final stage of the unloading process, control device 80 determines whether first sprocket 21 is engaged with tape 90 based on the current angle (α+Rs1) of first sprocket 21 calculated as described above. Then, control device 80 controls the remaining rotation amount of first sprocket 21 based on the result of the determination. As a result, control device 80 restricts contact between engagement protrusions 21a of first sprocket 21 and tape 90.

1-4. Unloading Process by Feeder 1

Figure 5:
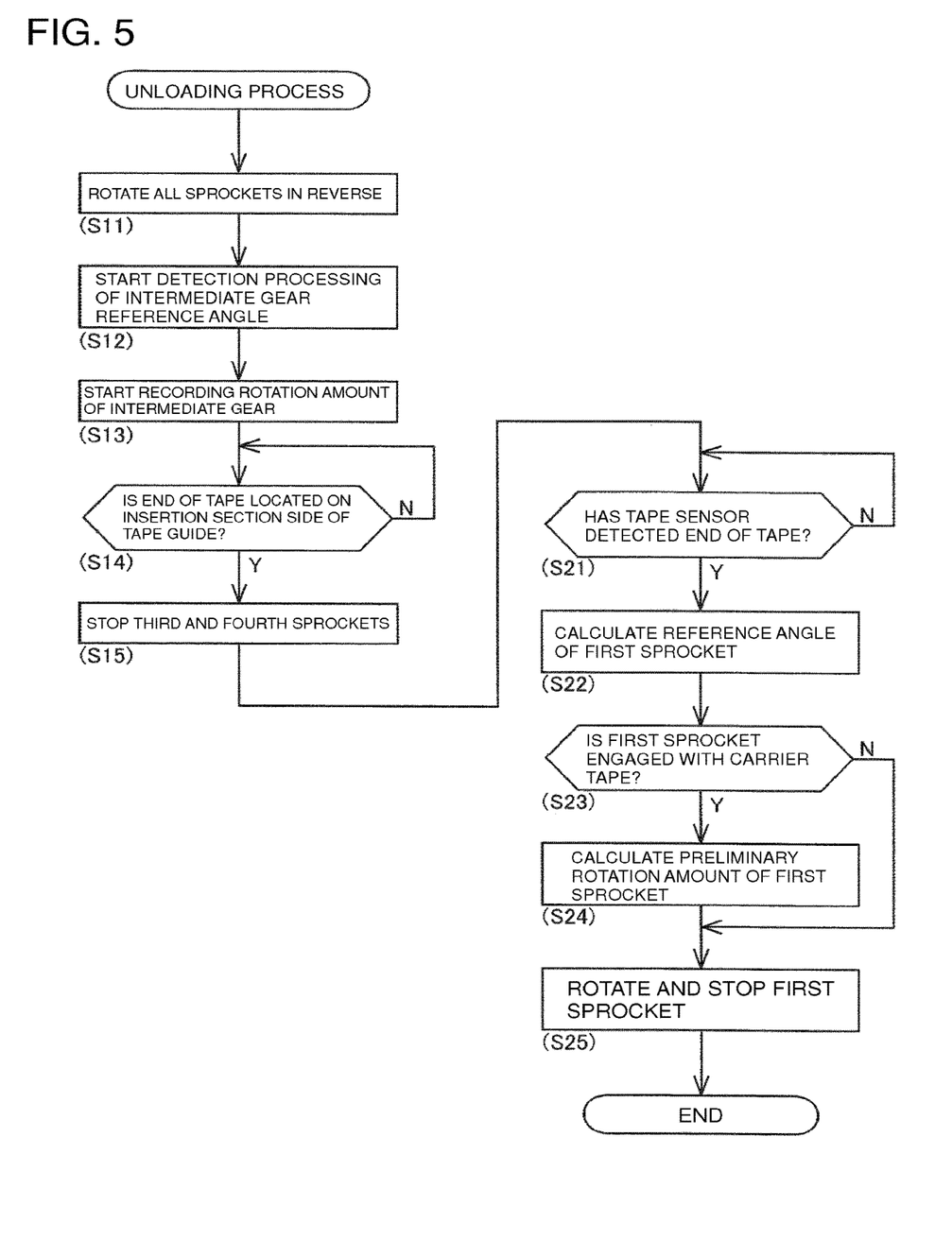
FIG. 5 A flow chart showing the unloading process.

The unloading process by feeder 1 will be described with reference to FIGS. 4 to 8. Here, it is assumed that tape 90 is loaded in feeder 1, and all sprockets 21, 22, 31, 32 are engaged with tape 90. For example, the operator presses an operation switch to start the unloading process, and feeder 1 executes the unloading process as shown in FIG. 5.

Control device 80 of feeder 1 first turns all sprockets (21, 22, 31, 32) in reverse (Step 11 (hereinafter "Step" is referred to as "S")). As a result, tape 90 loaded in feeder 1 is conveyed to the insertion section Pi side. Next, control device 80 starts detection processing of reference angle Ar of intermediate gear 25 with angle detection device 26 (S12). Specifically, control device 80 receives the detected value from angle detection device 26 and records the timing at which intermediate gear 25 reaches reference angle Ar.

Control device 80 starts recording the rotation amount Rm of intermediate gear 25 based on pulse power received by stepping motor 23 to rotate first sprocket 21 and second sprocket 22. Since the rotation amount Rm of intermediate gear 25 corresponds to the angle at which intermediate gear 25 rotates from detection of reference angle Ar of intermediate gear 25 until the current time, the rotation amount Rm is reset every time reference angle Ar of intermediate gear 25 is detected.

Subsequently, as long as the end of tape 90 is not detected on rail 11 on the insertion section Pi side of third sprocket 31 (S14: No), control device 80 continues driving with second driving device 30. The detection of the end of tape 90 is done based on the detection result of a tape sensor (not shown) positioned on the insertion section Pi side of third sprocket 31.

Thereafter, when the end of tape 90 is detected at the insertion section Pi side of third sprocket 31 (S14: Yes), control device 80 stops third sprocket 31 and fourth sprocket 32 (S15). Since driving by first driving device 20 is continued, tape 90 is conveyed to the insertion section Pi side. As long as tape sensor 61 does not detect the end of tape 90 (S21: No), control device 80 continues driving with first driving device 20.

When tape sensor 61 detects the end of tape 90 (S21: Yes), control device 80 controls so as to restrict contact between engagement protrusions 21a of first sprocket 21 and tape 90 in the following manner at the end stage of the unloading process. First, control device 80 calculates an angle (hereinafter referred to as a "reference angle θ") of first sprocket 21 when tape 90 is further conveyed to the insertion section Pi side and tape 90 traverses engagement range Ng engageable with second sprocket 22 (S22).

Here, "engagement range Ng" corresponds to a range in the conveyance direction of tape 90 in which engagement protrusions 22a of second sprocket 22 protrude from rail 11 and can contact tape 90, as shown in FIG. 4. Specifically, "engagement range Ng" is a range between two intersections of the upper surface of rail 11 and circle Ca formed by the tips of the teeth of second sprocket 22 in the side view of feeder 1. It should be noted that "when tape 90 traverses engagement range Ng" corresponds to when the end of tape 90 reaches the end of engagement range Ng on the insertion section Pi side. Therefore, control device 80 calculates the reference angle θ of first sprocket 21 as an estimated value in a period in which the end of tape 90 is between engagement range Ng and tape sensor 61 or within engagement range Ng (S22).

More specifically, control device 80 calculates the reference angle θ of first sprocket 21 by adding a rotation amount Rs2 of first sprocket 21, that is the rotation amount required for tape 90 to traverse engagement range Ng, to the current angle (α+Rs1) of first sprocket 21 (θ=α+Rs1+Rs2). In other words, the reference angle θ is a value obtained by adding an angle corresponding to the sum of the pulse power W1 received by stepping motor 23 from the last detection of reference angle Ar of intermediate gear 25 to the current time and the pulse power W2 received by stepping motor 23 until tape 90 traverses engagement range Ng to initial angle α (θ=α+f(W1+W2), where f(Wn) is the rotation amounts Rs1, Rs2 of first sprocket 21 corresponding to the pulse power Wn).

Here, when the end of tape 90 is detected by tape sensor 61, the extent to which tape 90 needs to be conveyed to the insertion section Pi side to traverse engagement range Ng is calculated. Specifically, tape 90 traverses engagement range Ng when tape 90 is conveyed by a length (D1+Ng/2) obtained by adding half the length of engagement range Ng to distance D1 between second sprocket 22 and tape sensor 61 from the time when the end of tape 90 is detected.

The rotational distance Rs2 of second sprocket 22 necessary to convey tape 90 by the length (D1+Ng/2) is calculated from the distance between engagement holes 91b in tape 90 and the distance between engagement protrusions 22a adjacent to each other in the circumferential direction in second sprocket 22. In the present embodiment, first sprocket 21 and second sprocket 22 share intermediate gear 25 and are synchronized so that the rotational direction and the circumferential speed are always the same. Therefore, when the required rotation amount Rs2 of second sprocket 22 calculated as described above is calculated, the rotation amount Rs2 of first sprocket 21 is also calculated at the same time.

Since the length (D1+Ng/2) is constant, the rotation amount Rs2 of first sprocket 21 from when the end of tape 90 is detected by tape sensor 61 to when tape 90 traverses the engagement region Ng is constant. The current angle (α+Rs1) of first sprocket 21 when the end of tape 90 is detected by tape sensor 61 is converted from rotation amount Rm of intermediate gear 25 at which recording is started in S13 (Rs1=2·Rm). In this way, control device 80 calculates the reference angle θ as an estimated angle θ (θ=α+2 Rm+Rs2).

More specifically, it is assumed that, for example, pulse power for rotating intermediate gear 25 by ¾ of rotation amount Rm is received by stepping motor 23 in a period from the last detection of reference angle Ar of intermediate gear 25 to the last detection of the end of tape 90. The current angle of first sprocket 21 is calculated to be 1.5 rotations from initial angle α. If the rotation amount Rs2 of first sprocket 21 corresponding to the length (D1+Ng/2) of tape 90 conveyed until tape 90 traverses engagement range Ng is an angle obtained by rotating first sprocket 21 by ⅓, the reference angle θ is calculated as an angle (390 deg) obtained by rotating first sprockets 21 by 13/12 from initial angle α.

Figure 6:
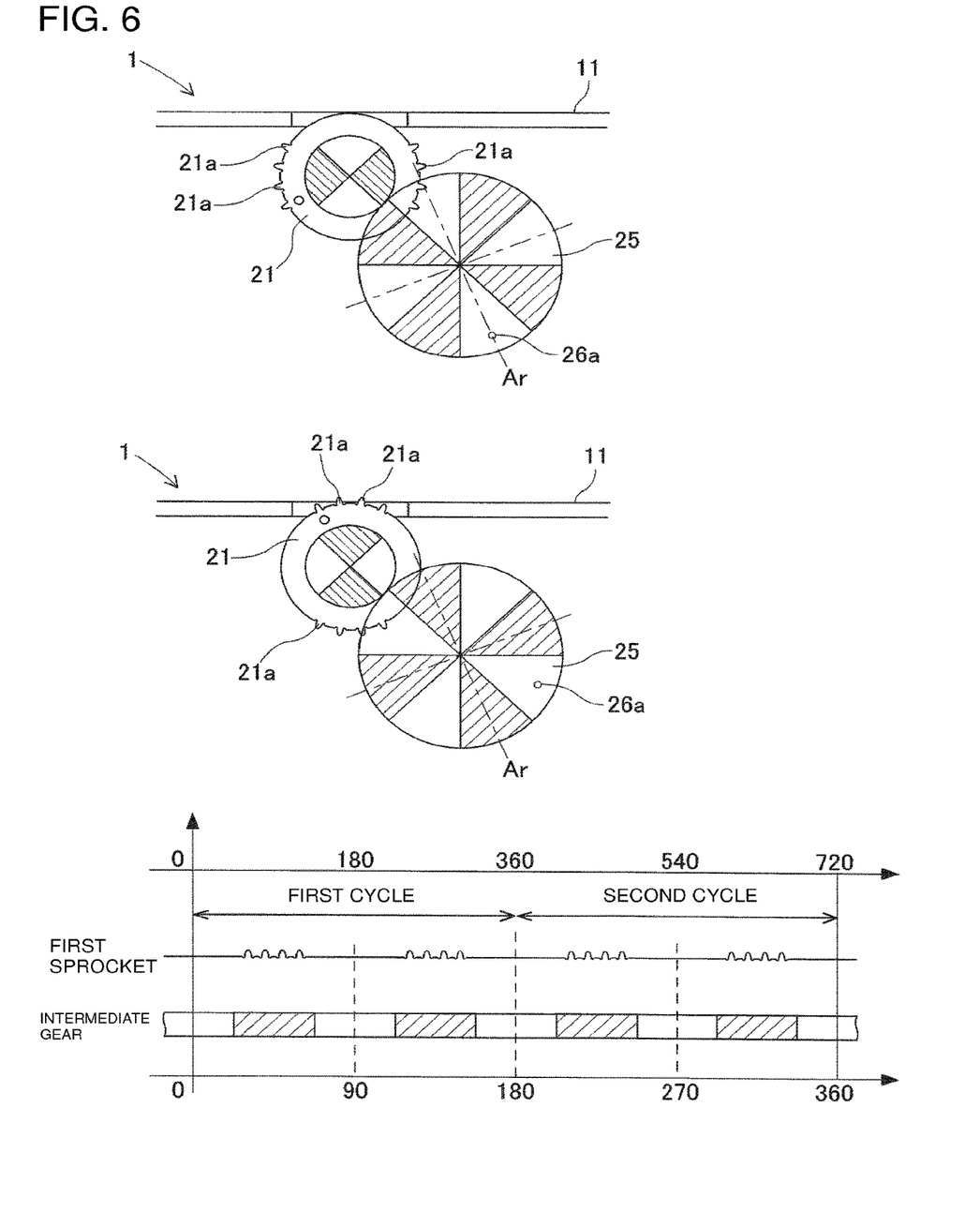
FIG. 6 A diagram showing the relationship between the angles of the intermediate gear and the first sprocket.
Figure 7:
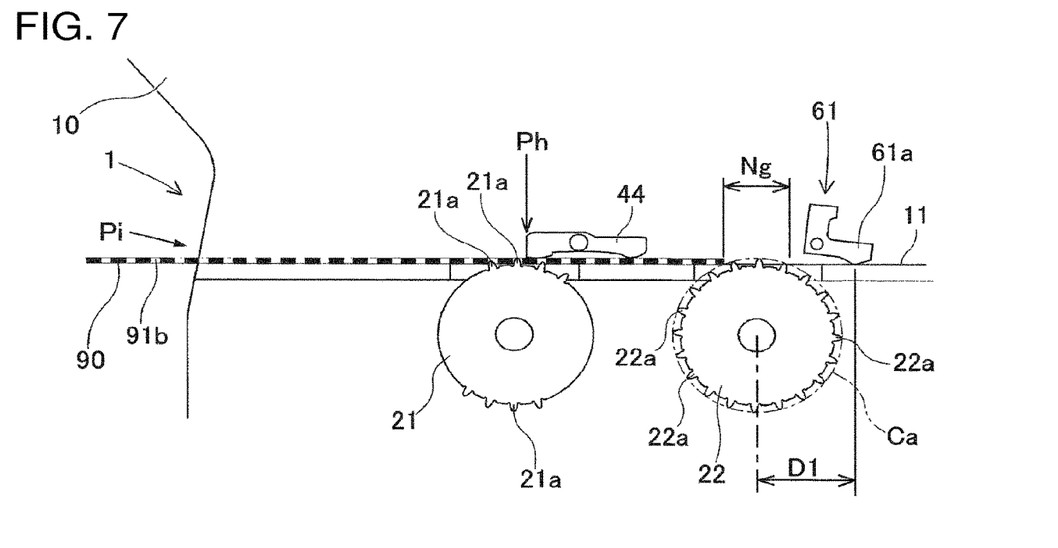
FIG. 7 A diagram showing a state in which the end of the carrier tape reaches the end of the engagement range at the end of the unloading process.

Next, control device 80 determines whether engagement protrusions 21a of first sprocket 21 engage with engagement holes 91b of tape 90, when tape 90 traverses the engagement range Ng, based on reference angle θ of first sprocket 21 (S23). FIG. 6 shows whether engagement protrusions 21a of first sprocket 21 engage with engagement hole 91b of tape 90 in respective angular ranges of intermediate gear 25 and first sprocket 21. The hatched portions in FIG. 6 indicate angular ranges in which engagement protrusions 21a of first sprocket 21 engage with engagement holes 91b of tape 90.

That is, as shown in the upper part of FIG. 6, when intermediate gear 25 is at reference angle Ar, engagement protrusions 21a of first sprocket 21 are at initial angle α and do not engage with engagement holes 91b of tape 90. On the other hand, as shown in the middle part of FIG. 6, when intermediate gear 25 is at an angle of ⅛ rotation from reference angle Ar, engagement protrusions 21a of first sprocket 21 are at an angle of ¼ rotation from initial angle α and engage with engagement holes 91b of tape 90. As described above, first sprocket 21 is switched between an engaged state and a disengaged state every time intermediate gear 25 rotates by an angular range of ⅛ rotation.

When engagement protrusions 21a of first sprocket 21 engage with engagement holes 91b of tape 90 when first sprocket 21 is at the reference angle θ calculated in S22 (S23: Yes), control device 80 calculates a preliminary rotation amount Rs3 of first sprocket 21 (S24). The preliminary rotation amount Rs3 is set to a value within a range from the rotation amount of the angle, at which first sprocket 21 disengages from tape 90, to the rotation amount of the angle at which first sprocket 21 contacts tape 90 again thereafter.

In the present embodiment, the preliminary rotation amount Rs3 is set to the rotation amount of first sprocket 21, being at the reference angle θ, either that of being needed to initial angle α or to the angle rotated one half from initial angle α, which is closer from the reference angle θ when rotating first sprocket 21 in the same direction. Then, control device 80 rotates first sprocket 21 from the present angle to reference angle θ (see FIG. 7), and stops first sprocket 21 at the point of time when first sprocket 21 is rotated by the preliminary rotational amount Rs3 (see FIG. 8, S25). At this time, second sprocket 22, synchronized with first sprocket 21, stops at the same time.

Figure 8:
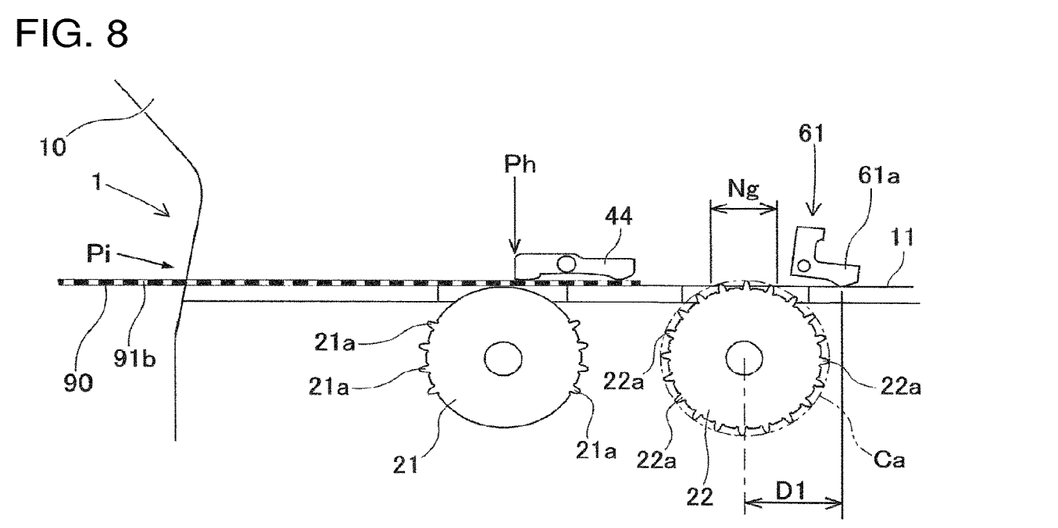
FIG. 8 A diagram showing the end state of the unloading process.

In this manner, when first sprocket 21 engages tape 90 (S23: Yes) when tape 90 traverses engagement range Ng engageable with second sprocket 22 in the unloading process, control device 80 rotates first sprocket 21 and stops first sprocket 21 at the angle at which first sprocket 21 is disengaged from tape 90 (S24, S25). In this embodiment, since the preliminary rotation amount Rs3 is calculated as described above in step S24, first sprocket 21 stops at initial angle α or at an angle which is ½ rotation from initial angle α. That is, as shown in FIG. 8, first sprocket 21 stops in an orientation in which engaging protrusions 21a face the conveyance direction.

On the other hand, if engagement protrusions 21a of first sprocket 21 do not engage with engagement holes 91b of tape 90 when first sprocket 21 is at the reference angle θ calculated in S22 (S23: No), control device 80 stops first sprocket 21 when first sprocket 21 is rotated from the current angle to the reference angle θ (S25). At this time, control device 80 sets the preliminary revolution Rs3 to 0. Control device 80 may set preliminary rotation amount Rs3 to be less than the rotation amount until engagement protrusions 21a of first sprocket 21 rotated from reference angle θ reaches the angle at which engagement protrusions 21a of first sprocket 21 can re-contact tape 90.

In this manner, when it is estimated that engagement protrusions 21a of first sprocket 21 are not engaged with engagement holes 91b of tape 90 when tape 90 traverses engagement range Ng in the unloading process (S23: No), control device 80 stops first sprocket 21 before engagement protrusions 21a of first sprocket 21 reach the angle at which they can contact tape 90 (S25).

As described above, in the ending stage of the unloading process, control device 80 stops first sprocket 21 when first sprocket 21 is rotated from the reference angle θ by the preliminary rotation amount Rs3. This stops first sprocket 21 at an angle at which any engaging protrusions 21a are under rail 11, that is, an angle at which engaging protrusions 21a are disengaged from tape 90. As a result, after second sprocket 22 is disengaged from tape 90, contact between engagement protrusions 21a of first sprocket 21 and tape 90 is restricted.

2. Effects of the Configuration of the Embodiment

With feeder 1, after second sprocket 22 is not engaged with tape 90 in the unloading process, the contact between engagement protrusions 21a of first sprocket 21 and tape 90 is restricted (S25). As a result, even if tape 90 is displaced in the conveyance direction by receiving an external force after traversing engagement range Ng, contact of engagement protrusions 21a with a portion other than engagement holes 91b of tape 90 is restricted. Therefore, modification or the like of tape 90 due to contact between engagement protrusions 21a of first sprocket 21 and tape 90 can be reliably prevented. When the unloading process is completed, operation lever 45 is pulled up by, for example, an operator, so that tape 90 can be pulled out.

3. Modifications of the Embodiment 3-1. Angle of First Sprocket 21

In the embodiment, intermediate gear 25 meshes with each of sprocket gears 21b and 22b to directly rotate first sprocket 21 and second sprocket 22. On the other hand, intermediate gear 25 may be configured to indirectly rotate first sprocket 21 and second sprocket 22 by interposing a second intermediate gear between sprocket gears 21b and 22b. Even in such a configuration, it is possible to calculate the angle of first sprocket 21 by detecting the angle of intermediate gear 25.

Further, the angle of first sprocket 21 may be directly detected by, for example, an angle sensor provided on first sprocket 21, in addition to the calculation based on the angle of intermediate gear 25, as exemplified in the embodiment. More specifically, the angle of first sprocket 21 may be calculated by detecting a Hall magnet provided on first sprocket 21 with a Hall sensor or by acquiring a detection value of an encoder provided on first sprocket 21.

3-2. Synchronization of First Sprocket and Second Sprocket

In the embodiment, since first sprocket 21 and second sprocket 22 are constantly engaged with intermediate gear 25 and the drive gear provided on the rotation shaft of stepping motor 23, they are synchronized so that the rotation direction and the peripheral speed are always equal. In contrast, first sprocket 21 and second sprocket 22 may be configured to operate asynchronously. More specifically, first sprocket 21 and second sprocket 22 may be configured to rotate by different driving sources, or may be configured to be temporarily removed from the driving path so as to be freely rotatable.

As described above, in the configuration in which first sprocket 21 and second sprocket 22 are rotated by different driving sources, control device 80 controls the rotation direction and the peripheral speed of first sprocket 21 and second sprocket 22 to be equal in the loading process in which tape 90 inserted into insertion section Pi is conveyed to the supply section Pt side in the conveyance direction. On the other hand, control device 80 stops first sprocket 21 at an angle at which first sprocket 21 disengages from tape 90 during a period from the start of the unloading process to the traversal of engagement range Ng in which tape 90 can engage with second sprocket 22.

Here, if first sprocket 21 and second sprocket 22 can operate asynchronously as in the above-described embodiment, after third sprocket 31 and fourth sprocket 32 are stopped during the execution of the unloading process, the conveyance of tape 90 can be entirely dependent on the rotation of second sprocket 22. Thus, during the unloading process, control device 80 stops first sprocket 21 beforehand at an angle at which contact with tape 90 is not possible. As a result, when tape 90 traverses engagement range Ng, since first sprocket 21 is not in contact with tape 90, it is possible to prevent first sprocket 21 from contacting tape 90 regardless of the timing at which second sprocket 22 is stopped. As a result, modification or the like of tape 90 by executing the unloading process can be reliably prevented.

REFERENCE SIGNS LIST

1: Feeder, 20: First driving device, 21: First sprocket, 22: Second sprocket, 23: Stepping motor, 25: Intermediate gear, 26: Angle detection device, 40: Tape support unit, 43: Retaining device, 61: Tape sensor, 80: Control device, 90: Carrier tape, 91: Base tape, 91b: Engagement hole, Pi: Insertion section, Pt: Supply section, Ng: (Second sprocket) Engagement range, D1: (Second sprocket to second tape sensor) Length, Ph: Defined position, Ar: Reference angle, Rm: (Intermediate gear) Rotation amount, Rs1,Rs2: (First sprocket) Rotation amount, Rs3: Preliminary rotation amount

The invention claimed is:

1. A feeder configured to convey a carrier tape from an insertion section to a supply section, the insertion section being configured to insert a carrier tape containing an electronic component, and the supply section being configured to supply the electronic component to an electronic component mounting machine;
the feeder comprising:
a first sprocket provided in the insertion section and having engagement protrusions, formed on only a part of the outer circumference, engageable with engagement holes of the carrier tape;
a second sprocket arranged side by side with the first sprocket, on the supply section side of the first sprocket, having engagement protrusions formed over the entire circumference; and
a control device configured to control a rotational operation of the first sprocket and the second sprocket,
wherein the control device restricts contact between the engagement protrusions of the first sprocket and the carrier tape after the engagement protrusions of the second sprocket disengage with the engagement holes of the carrier tape in an unloading process for conveying the carrier tape to the insertion section side.

2. The feeder of claim 1,
wherein the control device, at the time during the unloading process at which the engagement holes of the carrier tape have traversed an engagement range in which the engagement protrusions of the second sprocket can engage with the engagement holes of the carrier tape, rotates the first sprocket in a case where the engagement protrusions of the first sprocket engage with the engagement holes of the carrier tape until the engagement protrusions of the first sprocket reach an angle at which the engagement protrusions disengage from the engagement holes of the carrier tape, after which the control device stops rotating the first sprocket.

3. The feeder of claim 2, wherein the control device, at the time during the unloading process at which the engagement holes of the carrier tape have traversed an engagement range in which the engagement protrusions of the second sprocket can engage with the engagement holes of the carrier tape, stops the first sprocket in a case where the engagement protrusions of the first sprocket are not engaged with the engagement holes of the carrier tape before the engagement protrusions of the first sprocket reach an angle at which the engagement protrusions can come into contact with the carrier tape.

4. The feeder according to claim 2,
wherein the feeder is provided with a tape sensor on the supply section side of the second sprocket, the tape sensor being configured to detect the end of the carrier tape; and
wherein the control device determines whether the engagement protrusions of the first sprocket are engaged with the engagement holes of the carrier tape when the carrier tape has traversed the engagement range based on the distance between the second sprocket and the tape sensor and the angle of the first sprocket when the end of the tape is detected.

5. The feeder of claim 2, wherein the feeder comprises an angle detection device configured to detect an angle of an intermediate gear configured to directly or indirectly rotate the first sprocket; and the control device calculates the angle of the first sprocket based on an angle of the first sprocket defined with respect to a reference angle of the intermediate gear.

6. The feeder of claim 5, wherein the control device calculates the angle of the first sprocket during at least a portion of a period from the start of the unloading process until the carrier tape has traversed the engagement range.

7. The feeder of claim 5, wherein the intermediate gear is shared so as to directly rotate the first sprocket and the second sprocket together.

8. The feeder of claim 5,
wherein the feeder comprises a stepping motor as a driving source configured to rotate the first sprocket and the second sprocket through the intermediate gear; and
wherein the control device calculates the angle of the first sprocket based on the rotation amount of the intermediate gear according to pulse power received by the stepping motor, from the moment at which the reference angle of the intermediate gear is detected by the angle detection device to the present moment.

9. The feeder of claim 1, wherein the feeder comprises a retaining device configured to engage the engagement holes of the carrier tape to restrict movement of the carrier tape toward the insertion section when the end of the carrier tape is on the insertion section side with respect to a defined position between the first sprocket and the second sprocket.

* * * * *